United States Patent
Lehr et al.

(10) Patent No.: US 6,429,503 B2
(45) Date of Patent: Aug. 6, 2002

(54) CONNECTION ELEMENT IN AN INTEGRATED CIRCUIT HAVING A LAYER STRUCTURE DISPOSED BETWEEN TWO CONDUCTIVE STRUCTURES

(75) Inventors: Matthias Uwe Lehr; Rene Tews, both of Dresden; Jochen Müller, München; Jürgen Lindolf, Friedberg, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/888,034

(22) Filed: Jun. 22, 2001

(30) Foreign Application Priority Data

Jun. 22, 2000 (DE) .......................................... 100 30 442

(51) Int. Cl.[7] .............................................. H01L 29/00
(52) U.S. Cl. ..................... 257/530; 257/758; 257/763
(58) Field of Search ................................ 257/530, 685, 257/686, 701, 702, 729, 741, 750, 752, 754, 763, 765, 771, 773, 774, 700, 758, 764, 767

(56) References Cited

U.S. PATENT DOCUMENTS

| 5,411,917 A | | 5/1995 | Forouhi et al. | |
|---|---|---|---|---|
| 5,602,053 A | | 2/1997 | Zheng et al. | |
| 5,629,238 A | * | 5/1997 | Choi et al. | 438/645 |
| 5,872,385 A | * | 2/1999 | Taft et al. | 257/413 |
| 6,033,980 A | * | 3/2000 | Liou et al. | 438/624 |
| 6,127,265 A | * | 10/2000 | Tomita | 438/637 |
| 6,191,484 B1 | * | 2/2001 | Huang et al. | 257/752 |
| 6,215,190 B1 | * | 4/2001 | Bruce et al. | 257/640 |

* cited by examiner

*Primary Examiner*—Nathan Flynn
*Assistant Examiner*—Pershelle Greene
(74) *Attorney, Agent, or Firm*—Laurence A. Greenberg; Werner H. Stemer; Gregory L. Mayback

(57) ABSTRACT

A connection element in an integrated circuit having a layer structure disposed between two conductive structures. The layer structure is formed by an insulating layer, which can be destroyed by application of a predetermined voltage, and a silicon layer. The insulating layer adjoins a first conductive structure made of tungsten.

8 Claims, 1 Drawing Sheet

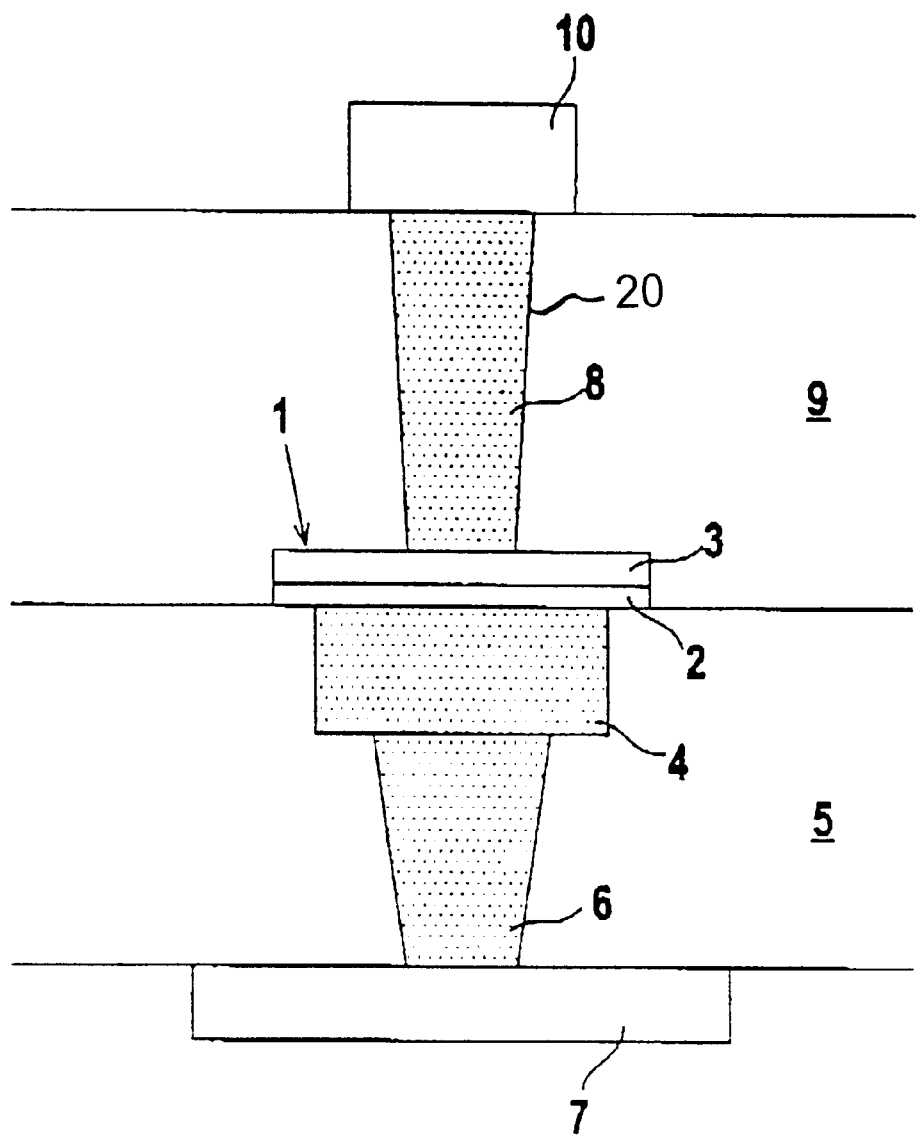

CONNECTION ELEMENT IN AN INTEGRATED CIRCUIT HAVING A LAYER STRUCTURE DISPOSED BETWEEN TWO CONDUCTIVE STRUCTURES

BACKGROUND OF THE INVENTION

Field of the Invention

The invention relates to a connection element.

Connection elements of this type are used in integrated circuits in order, for example, to activate redundant memory cells in dynamic random access memories (DRAMs). Furthermore, connection elements of this type can be used in order to write identifiers to chips or in order to change functionalities of chips in a targeted manner. In particular, connection elements of this type can be used as programmable connection elements in the field of FPGAs.

In this case, the connection elements can be configured as fuse circuits or antifuse circuits. A fuse circuit has a structure via which a current flows as long as the structure is intact. The structure can be destroyed by irradiation with laser light or by an application of a voltage, with the result that current can then no longer flow.

A connection element configured as an antifuse circuit typically has a layer structure having an insulating layer— such as, for example, a dielectric layer—which is disposed between two conductive layers.

With the insulating layer intact, no current flows via the connection element. Only when a predetermined electric voltage is applied to the connection element is the dielectric layer destroyed, with the result that a current can then flow.

The voltage is applied via contacts, interconnects or similar structures which are led to the conductive layers of the layer structure of the connection element. In known connection elements of this type, the conductive layers of the layer structure are composed of polysilicon or amorphous silicon. A conductive structure composed of tungsten is led to at least one of the layers. The conductive structure may be formed, in particular, by an interconnect on whose surface the layer structure is applied.

Configurations of this type have the disadvantage that high deposition temperatures are required for the deposition of the tungsten forming the interconnect and also of the polysilicon layers. As a result of this, the tungsten which forms the interconnect reacts with the adjoining polysilicon layer to form WSix, as a result of which an undesirably rough interface between the interconnect and the conductive layer is obtained.

As a result, there is the risk that the polysilicon layer deposited on the tungsten will have a greatly inhomogeneous layer thickness, as a result of which electrical breakdowns can arise which greatly impair the functionality of the connection element.

Finally, it is disadvantageous that polysilicon has a comparatively low conductivity, so that relatively high voltages must be applied to the connection element in order to destroy the insulating layer.

U.S. Pat. No. 5,602,053 describes a method for fabricating an antifuse structure. The antifuse structure is disposed between two conductive contacts. Each contact has a lateral barrier layer made of titanium nitride, titanium tungsten or tantalum nitride. A layer made of aluminum, copper, tungsten or silver is deposited within the barrier layer. A layer structure formed from four layers lying one above the other is applied as the antifuse structure to the upper interface of such a contact. The first layer is composed of silicon nitride and bears on the interface of the contact. A layer made of amorphous silicon is applied to the silicon nitride layer, and a layer made of silicon nitride is in turn applied to the layer made of amorphous silicon. A further layer made of amorphous silicon is applied on the layer made of silicon nitride. Finally, the top side of the further layer made of amorphous silicon is adjoined by the second contact.

SUMMARY OF THE INVENTION

It is accordingly an object of the invention to provide a connection element which overcomes the above-mentioned disadvantages of the prior art devices of this general type, which has a high reliability in conjunction with the smallest possible topography.

With the foregoing and other objects in view there is provided, in accordance with the invention, a connection element formed in an integrated circuit. The connection element contains a substrate, an interconnect disposed on the substrate and formed of tungsten, an insulating layer disposed on the interconnect, and a silicon layer disposed on the insulating layer and formed of a polycrystalline doped silicon. The insulating layer can be destroyed by an application of a predetermined voltage to produce a conductive connection between the interconnect and the silicon layer.

The connection element according to the invention has a layer structure disposed between two conductive structures. The layer structure contains an insulating layer, which can be destroyed by application of an electrical voltage, and a silicon layer. The silicon layer is preferably composed of polysilicon or $Si_3N_4$. In principle, the silicon layer may also be composed of amorphous silicon.

The insulating layer adjoins a conductive structure composed of tungsten. In an advantageous embodiment, the insulating layer bears directly on the surface of the interconnect composed of tungsten.

Thus, the basic concept of the invention is that, in contrast to conventional layer structures, the insulating layer is not disposed between two silicon layers. Rather, the insulating layer bears directly on the interconnect composed of tungsten.

An essential advantage of the configuration is that, at the interface between the conductive structure composed of tungsten and the layer structure, interface reactions between the polysilicon and the tungsten which lead to roughening of the interface are avoided.

Thus, when the insulating layer is applied to the surface of the conductive structure composed of tungsten, in particular the interconnect composed of tungsten, a homogeneous layer thickness of the insulating layer is obtained.

As a result, the risk of electrical breakdowns in the region of the insulating layer is largely avoided, so that high reliability of the connection element is obtained.

It is particularly advantageous, moreover, that the deposition of the insulating layer on the tungsten can be carried out at high deposition temperatures since, at the interface, there is now no risk of a reaction of the tungsten with the silicon to form WSix. On account of this, furnace deposition processes can be used for fabricating the dielectric layer, thereby obtaining particularly controlled process management. In particular, this results in particularly uniform layer thicknesses of the insulating layer.

A further essential advantage of the connection element according to the invention is that the layer structure has only two layers. This results in a particularly small topography of the layer structure. Moreover, the latter can be fabricated simply and in a small number of method steps.

Furthermore, it is advantageous that, as a result of the insulating layer being directly linked to the conductive structure, low voltages already suffice to destroy the insulating layer.

In an advantageous embodiment of the invention, the second conductive structure is formed by a contact made of tungsten. In order to fabricate the contact, a contact hole is etched into an oxide layer as far as the silicon layer of the layer structure, the silicon layer adjoins the underside of the oxide layer. The silicon layer, which is preferably composed of polysilicon, serves as an etching stop for the etching process.

In accordance with an added feature of the invention, the interconnect has a top side and the insulating layer is applied to the top side of the interconnect by a furnace deposition process.

In accordance with an additional feature of the invention, the furnace deposition process is a low pressure chemical vapor deposition method.

In accordance with another feature of the invention, a contact is disposed on the silicon layer and a further interconnect is connected to the contact. The silicon layer is connected to the further interconnect through the contact.

In accordance with a further feature of the invention, an oxide layer having a contact hole etched therein is provided. The contact is formed by a tungsten layer deposited in the contact hole. The silicon layer forms an etching stop layer for an etching of the contact hole.

In accordance with a concomitant feature of the invention, the further interconnect contains aluminum.

Other features which are considered as characteristic for the invention are set forth in the appended claims.

Although the invention is illustrated and described herein as embodied in a connection element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The single FIGURE of the drawing is a diagrammatic illustration of an exemplary embodiment of a connection element according to the invention.

DESCRIPTION OF THE PREFERRED EMBODIMENTS

Referring now to the single figure of the drawing in detail, there is shown an exemplary embodiment of a connection element configured as an antifuse circuit.

The connection element has a layer structure 1 having an insulating layer 2.

With the insulating layer 2 intact, no current flows through the connection element. The insulating layer 2 can be destroyed by application of a predetermined voltage, so that an electric current can then flow through the connection element. Such connection elements configured as antifuse circuits are used in integrated circuits, for example in order to activate redundant memory cells in DRAMs. In addition, the connection elements can be used for writing identifiers to chips or for changing functionalities of chips. In particular, the antifuse circuits can be used as programmable connection elements for FPGAs.

In the exemplary embodiment illustrated in FIG. 1, the layer structure 1 has, in addition to the insulating layer 2, a silicon layer 3 applied on the insulating layer 2. The silicon layer 3 is preferably composed of polysilicon. As an alternative, the silicon layer 3 may be formed from amorphous silicon.

The insulating layer 2 itself is preferably composed of $Si_3N_4$. As an alternative, $SiO_2$ can be used for the insulating layer 2.

The insulating layer 2 and the silicon layer 3 are each configured as planar layers and, moreover, have the same area. A layer thickness of the insulating layer 2 is smaller than a layer thickness of the silicon layer 3.

The underside of the layer structure 1 is adjoined by a first conductive structure formed by a first interconnect 4 composed of tungsten.

From the first interconnect 4, a contact 6 made of tungsten and running in a first oxide layer 5 leads to a silicon layer 7 functioning as a substrate 7, in which integrated circuits are incorporated.

A top side of the layer structure 1 is adjoined by a second conductive structure which, in the present exemplary embodiment, is formed by a contact 8 composed of tungsten. The contact 8 runs in a second oxide layer 9 and, at its top side, adjoins an interconnect 10 which runs in a second interconnect plane and is composed of aluminum in the present exemplary embodiment. The second interconnect plane runs above the first interconnect plane in which lies the second interconnect 10 composed of tungsten.

In order to fabricate the first contact 6 with the first interconnect 4 made of tungsten lying above it, trenches corresponding to the contact 6 and the interconnect 4 are etched into the first oxide layer 5, through which tungsten is deposited into the trenches. Such structures form so-called dual damascene structures in which a contact and an interconnect are produced at the same time by deposition of one layer, in this case tungsten.

The layer structure 1 of the connection element is applied to this interface of the interconnect 4 composed of tungsten. In contrast to conventional layer structures, what bears on the interconnect 4 is not polysilicon as the conductive layer, but rather directly the insulating layer 2 composed of $Si_3N_4$ or $SiO_2$.

Thus, a reaction between the silicon and the tungsten to form WSix is avoided at the interface of the first interconnect 4, the reaction resulting in undesirable roughening at the interface between the layer structure 1 and the first interconnect 4.

Since the formation of WSix is precluded at this interface, the insulating layer 2 can be applied to the surface of the interconnect 4 even at high deposition temperatures.

As a result, in order to obtain particularly homogeneous layer thicknesses of the insulating layer 2, the latter can be applied to the interconnect 4 in a furnace deposition process. A low-pressure chemical vapor deposition (LPCVD) method is particularly advantageously chosen as the deposition process. Considerably more uniform layer thicknesses are obtained with this method than, for example, in the case of a plasma-enhanced CVD method carried out at low deposition temperatures. As a result, the risk of electrical breakdowns is avoided even in the case of small layer thicknesses of the insulating layer 2.

The silicon layer 3 is subsequently applied to the insulating layer 2. The silicon layer 3 is expediently deposited by a CVD method or a PVD method. In particular, the silicon layer 3 can be produced by an LPCVD method.

In order to fabricate the contact 8 above the layer structure 1, in a first method step a contact hole 20 is etched into the second oxide layer 9. The silicon layer 3 serves as etching stop in the process, the silicon layer 3 having the requisite layer thickness. Tungsten is subsequently deposited into the contact hole.

Afterward, the second interconnect 10 composed of aluminum is fabricated in a known manner in the interconnect plane running above the second oxide layer 9.

We claim:

1. A connection element formed in an integrated circuit, the connection element comprising:
   a substrate;
   an interconnect disposed on said substrate and formed of tungsten;
   an insulating layer disposed on said interconnect; and
   a silicon layer disposed on said insulating layer and formed of a polycrystalline doped silicon, said insulating layer able to be destroyed by an application of a predetermined voltage to produce a conductive connection between said interconnect and said silicon layer.

2. The connection element according to claim 1, wherein said insulating layer contains a material selected from the group consisting of $Si_3N_4$ and $SiO_2$.

3. The connection element according to claim 1, wherein said interconnect has a top side and said insulating layer is applied to said top side of said interconnect by a furnace deposition process.

4. The connection element according to claim 3, wherein said furnace deposition process is a low pressure chemical vapor deposition method.

5. The connection element according to claim 1, including:
   a contact disposed on said silicon layer; and
   a further interconnect connected to said contact, said silicon layer connected to said further interconnect through said contact.

6. The connection element according to claim 5, including an oxide layer having a contact hole etched therein, and said contact is formed by a tungsten layer deposited in said contact hole.

7. The connection element according to claim 6, wherein said silicon layer forms an etching stop layer for an etching of said contact hole.

8. The connection element according to claim 5, wherein said further interconnect contains aluminum.

* * * * *